US009435692B2

(12) United States Patent
Waldmann et al.

(10) Patent No.: US 9,435,692 B2
(45) Date of Patent: Sep. 6, 2016

(54) CALCULATING POWER INPUT TO AN ARRAY OF THERMAL CONTROL ELEMENTS TO ACHIEVE A TWO-DIMENSIONAL TEMPERATURE OUTPUT

(71) Applicant: Lam Research Corporation, Fremont, CA (US)

(72) Inventors: Ole Waldmann, Oakland, CA (US); Eric A. Pape, Campbell, CA (US); Robert Griffith O'Neill, Hayward, CA (US); Francisco Martinez, Dublin (IE)

(73) Assignee: LAM RESEARCH CORPORATION, Fremont, CA (US)

( * ) Notice: Subject to any disclaimer, the term of this patent is extended or adjusted under 35 U.S.C. 154(b) by 383 days.

(21) Appl. No.: 14/173,149

(22) Filed: Feb. 5, 2014

(65) Prior Publication Data

US 2015/0219499 A1    Aug. 6, 2015

(51) Int. Cl.
| | | |
|---|---|---|
| *G01K 15/00* | (2006.01) | |
| *G01J 5/02* | (2006.01) | |
| *H01L 21/67* | (2006.01) | |
| *H01L 21/683* | (2006.01) | |

(52) U.S. Cl.
CPC .......... *G01J 5/02* (2013.01); *H01L 21/67109* (2013.01); *H01L 21/67248* (2013.01); *H01L 21/6831* (2013.01)

(58) Field of Classification Search
USPC ............................................ 374/1, 120, 141
See application file for complete search history.

(56) References Cited

U.S. PATENT DOCUMENTS

| | | | |
|---|---|---|---|
| 6,164,816 A * | 12/2000 | Aderhold ............. | G01J 5/0003 356/43 |
| 6,746,908 B2 * | 6/2004 | Tanaka .................... | C23C 16/46 438/225 |
| 6,784,428 B2 | 8/2004 | Rabolt et al. | |
| 7,397,555 B2 | 7/2008 | Owczarz et al. | |
| 7,454,052 B2 | 11/2008 | Smilansky et al. | |
| 7,627,493 B1 | 12/2009 | Sarthi et al. | |
| 7,667,198 B2 | 2/2010 | Strandemar | |
| 7,851,759 B2 | 12/2010 | Aksyuk et al. | |
| 7,939,784 B2 | 5/2011 | Steger et al. | |
| 8,109,669 B2 * | 2/2012 | Aderhold ............. | G01J 5/0003 219/494 |
| 8,150,242 B2 | 4/2012 | Merry et al. | |
| 8,258,296 B2 | 9/2012 | Paredes et al. | |
| 8,289,050 B2 | 10/2012 | Mccoy | |
| 8,461,674 B2 | 6/2013 | Gaff et al. | |
| 8,546,732 B2 | 10/2013 | Singh | |
| 8,547,545 B2 | 10/2013 | Sasazawa et al. | |

(Continued)

*Primary Examiner* — Mirellys Jagan
(74) *Attorney, Agent, or Firm* — Buchanan Ingersoll & Rooney PC

(57) ABSTRACT

A method for calculating power input to at least one thermal control element of an electrostatic chuck includes: setting the at least one thermal control element to a first predetermined power level; measuring a first temperature of the at least one thermal control element when the at least one thermal control element is powered at the first predetermined power level; setting the at least one thermal control element to a second predetermined power level; measuring a second temperature of the at least one thermal control element when the at least one thermal control element is powered at the second predetermined power level; calculating a difference between the first temperature and the second temperature; calculating a system response of the at least one thermal control element based on the difference; inverting the system response; and calibrating the at least one thermal control element based on the inverted system response.

20 Claims, 3 Drawing Sheets

(56) References Cited

U.S. PATENT DOCUMENTS

| | | |
|---|---|---|
| 8,589,108 B2 | 11/2013 | Nikaido |
| 8,624,168 B2 | 1/2014 | Gaff et al. |
| 8,637,794 B2 | 1/2014 | Singh et al. |
| 8,642,480 B2 | 2/2014 | Gaff et al. |
| 2007/0177788 A1 | 8/2007 | Liu |
| 2009/0105867 A1* | 4/2009 | Yamaguchi ............ C23C 16/46 700/121 |
| 2011/0216803 A1* | 9/2011 | Timans ................ G01J 5/0003 374/1 |
| 2012/0097661 A1 | 4/2012 | Singh |
| 2012/0118225 A1 | 5/2012 | Hsu et al. |
| 2012/0183915 A1 | 7/2012 | Merry et al. |
| 2013/0072025 A1 | 3/2013 | Singh et al. |
| 2013/0220989 A1 | 8/2013 | Pease et al. |
| 2013/0270250 A1 | 10/2013 | Pease et al. |
| 2014/0045337 A1 | 2/2014 | Singh et al. |
| 2014/0047705 A1 | 2/2014 | Singh et al. |
| 2014/0096909 A1 | 4/2014 | Singh et al. |
| 2015/0364388 A1* | 12/2015 | Waldmann ........ H01L 21/67109 438/5 |

\* cited by examiner

CALCULATING POWER INPUT TO AN ARRAY OF THERMAL CONTROL ELEMENTS TO ACHIEVE A TWO-DIMENSIONAL TEMPERATURE OUTPUT

BACKGROUND

With each successive semiconductor technology generation, substrate diameters tend to increase and transistor sizes decrease, resulting in the need for an ever higher degree of accuracy and repeatability in substrate processing.

Plasma processing systems available today are among those semiconductor fabrication tools which are subject to an increasing need for improved accuracy and repeatability. One metric for plasma processing systems is increased uniformity, which includes uniformity of process results on a semiconductor substrate surface as well as uniformity of process results of a succession of substrates processed with nominally the same input parameters. Continuous improvement of on-substrate uniformity is desirable. Among other things, this calls for plasma chambers with improved uniformity, consistency and self-diagnostics. Controlling the temperature of an electrostatic chuck (ESC) during etch and/or deposition process of a semiconductor chip wafer is critical to control the uniformity of the critical dimension (CD) across the wafer, ideally, this is done with a high spatial resolution to compensate for any non-uniformities of the wafer before the etch and/or deposition process.

SUMMARY

According to one embodiment, a method for calculating power input to at least one thermal control element of an electrostatic chuck having an array of independently controllable heater zones, comprises: setting, with a control unit including a processor, the at least one thermal control element in the electrostatic chuck to a first predetermined power level; measuring, with a temperature detector, a first temperature of the at least one thermal control element when the at least one thermal control element is powered at the first predetermined power level; setting, with the processor, the at least one thermal control element to a second predetermined power level; measuring, with the temperature detector, a second temperature of the at least one thermal control element when the at least one thermal control element is powered at the second predetermined power level; calculating a difference between the first temperature and the second temperature that are measured; calculating a system response of the at least one thermal control element based on the difference that is calculated; inverting the system response that is calculated; and calibrating the at least one thermal control element of the electrostatic chuck based on the inverted system response.

According to another embodiment, a non-transitory computer readable storage medium, stores instructions, which when executed by a processor, performs a method for calculating power input to at least one thermal control element of an electrostatic chuck having an array of independently controllable heater zones. The instructions cause the following steps to be carried out: (1) setting the at least one thermal control element in the electrostatic chuck to a first predetermined power level; (2) measuring, with a temperature detector, a first temperature of the at least one thermal control element when the at least one thermal control element is powered at the first predetermined power level; (3) setting the at least one thermal control element to a second predetermined power level; (4) measuring, with the temperature detector, a second temperature of the at least one thermal control element when the at least one thermal control element is powered at the second predetermined power level; (5) calculating a difference between the first temperature and the second temperature that are measured; (6) calculating a system response of the at least one thermal control element based on the difference that is calculated; (7) inverting the system response that is calculated; and (8) calibrating the at least one thermal control element of the electrostatic chuck based on the inverted system response.

These and other exemplary features and advantages of particular embodiments of the method for calculating power input to at least one thermal control element of an electrostatic chuck will now be described by way of exemplary embodiments to which they are not limited.

BRIEF DESCRIPTION OF THE DRAWINGS

The scope of the present disclosure is best understood from the following detailed description of exemplary embodiments when read in conjunction with the accompanying drawings. Included in the drawings are the following figures.

Further areas of applicability of the present disclosure will become apparent from the detailed description provided hereinafter. It should be understood that the detailed description of exemplary embodiments are intended for illustration purposes only and are, therefore, not intended to necessarily limit the scope of the disclosure.

DETAILED DESCRIPTION

Figure 1:
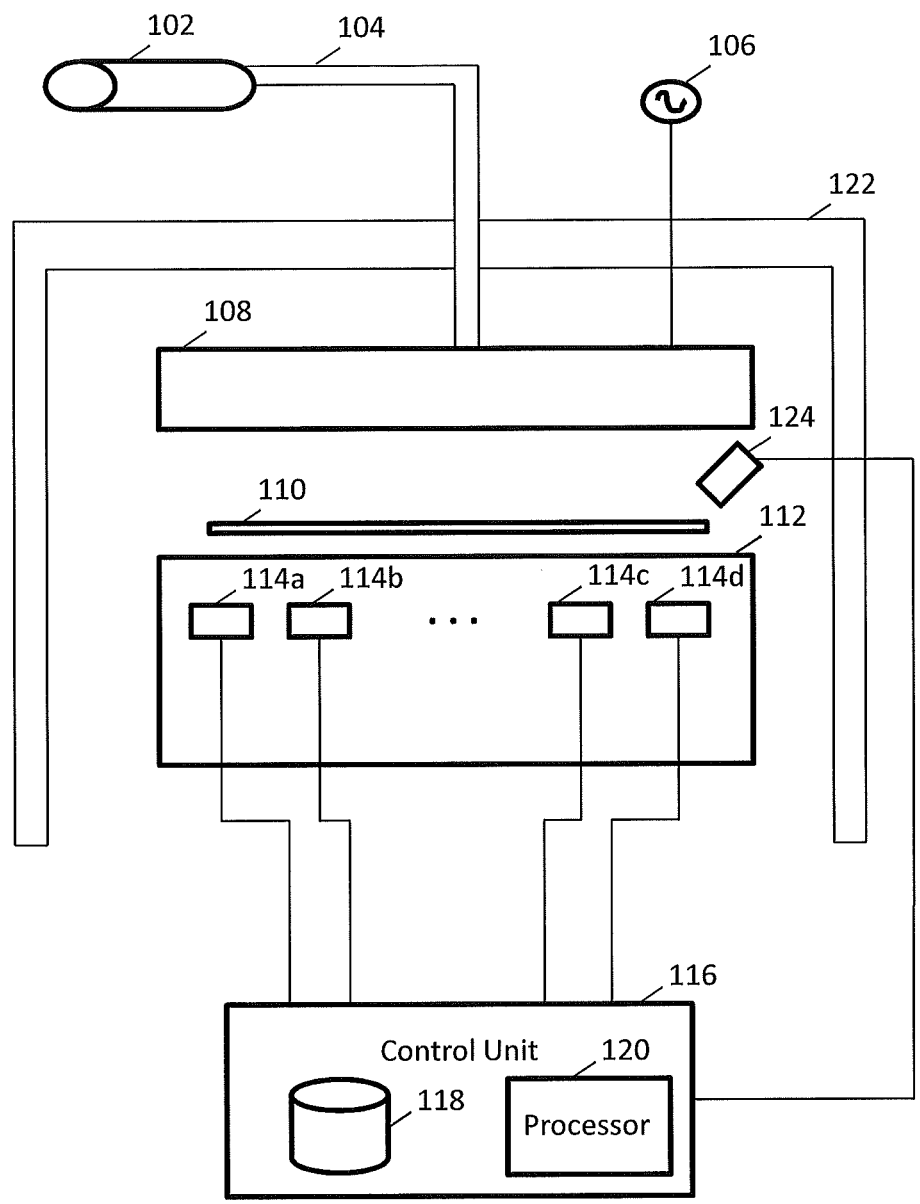
FIG. 1 illustrates a system architecture that may be employed in accordance with an exemplary embodiment.

FIG. 1 shows an exemplary schematic of a plasma processing chamber including a chamber 122 having an upper showerhead electrode 108 and a substrate support assembly, for example an electrostatic chuck 112, incorporating a heating plate. A substrate 110 is loaded through a loading port (not shown) onto the electrostatic chuck 112. A gas line 104 supplies process gas to the upper showerhead electrode 108 which delivers the process gas into the chamber. A gas source 102 (e.g. a mass flow controller supplying a suitable gas mixture) is connected to the gas line 104. A radio-frequency (RF) power source 106 is connected to the upper showerhead electrode 108. In operation, the chamber is evacuated by a vacuum pump and the RF power is capacitively coupled between the upper showerhead electrode 108 and a lower electrode in the electrostatic chuck 112 to energize the process gas into a plasma in the space between the substrate 110 and the upper showerhead electrode 108. The plasma can be used to etch device die features into layers on the substrate 110. The electrostatic chuck 112 may have heaters incorporated therein. For example, the electrostatic chuck may include at least one temperature control element 114 (114a, 114b, 114c, 114d, etc.) that can heat the electrostatic chuck 112 to desired temperatures. Each temperature control element 114 is connected to a control unit 116, which includes a storage device 118 for storing data, such as a hard drive, read-only memory (ROM), random-access memory (RAM), optical drive, flash memory, magnetic tape drive, etc. A chamber 122 can be used that does not have RF/power control, etc.

The control unit 116 can also include a computer processor 120. Instead of one control unit 116, multiple control units can be used. The control unit 116 may be implemented as computer-readable code compiled on a computer, thus making it a specific purpose computer. For example, the control unit 116 may be implemented in a computer system using hardware, software, firmware, non-transitory computer readable media having instructions stored thereon, or a combination thereof, and may be implemented in one or more computer systems or other processing systems. Hardware, software, or any combination thereof may embody modules and components used to implement the methods of FIGS. 2 and 3.

If programmable logic is used, such logic may execute on a commercially available processing platform or a special purpose device. A person having ordinary skill in the art may appreciate that embodiments disclosed herein can be practiced with various computer system configurations, including multi-core multiprocessor systems, minicomputers, mainframe computers, computers linked or clustered with distributed functions, as well as pervasive or miniature computers that may be embedded into virtually any device. For instance, at least one processor device and a memory may be used to implement the above described embodiments.

A processor device as discussed herein may be a single processor, a plurality of processors, or combinations thereof. Processor devices may have one or more processor "cores." The terms "computer program medium," "non-transitory computer readable medium," and "computer usable medium" as discussed herein are used to generally refer to tangible media such as a removable storage unit or a hard disk installed in hard disk drive.

Various embodiments are described in terms of exemplary control unit 116. After reading this description, it will become apparent to a person skilled in the relevant art how to implement such embodiments using other computer systems and/or computer architectures. Although operations may be described as a sequential process, some of the operations may in fact be performed in parallel, concurrently, and/or in a distributed environment, and with program code stored locally or remotely for access by single or multi-processor machines. In addition, in some embodiments the order of operations may be rearranged.

Processor device 120 may be a special purpose or a general purpose processor device. The processor device 120 may be connected to a communication infrastructure, such as a bus, message queue, network, multi-core message-passing scheme, etc. The network may be any network suitable for performing the functions as disclosed herein and may include a local area network (LAN), a wide area network (WAN), a wireless network (e.g., WiFi), a mobile communication network, a satellite network, the Internet, fiber optic, coaxial cable, infrared, radio frequency (RF), or any combination thereof. Other suitable network types and configurations will be apparent to persons having skill in the relevant art.

It should be appreciated that while the detailed design of the plasma processing chamber may vary (for example, the chamber can be an inductively coupled plasma processing chamber, helicon, microwave, or other type chamber, the showerhead electrode would be replaced with an RF antenna), RF power is coupled to the plasma through the electrostatic chuck 112.

In an exemplary embodiment, an electrostatic chuck 112 can be controlled so that the electrostatic chuck 112 ceramic surface temperature, and therefore the wafer substrate 110 temperature, is controlled by an array of thermal control elements 114. For example, the array can include at least 100 temperature control elements, e.g., up to 400. The wafer temperature, and consequently the plasma etch process, can be controlled for each device die position to maximize the yield of devices from a wafer. A temperature detector 124, for example an infrared camera, detects the surface temperature of the electrostatic chuck 112, and/or wafer substrate 110.

In an exemplary embodiment, the control unit 116 or another controller, creates/executes an algorithm to determine the relation between power input and temperature output of thermal control elements 114. The relation between power input and temperature output of thermal control elements 114 allows for the stabilization and control of the temperature of the electrostatic chuck 112 while processing a wafer. Also, the relation between power input and temperature output of thermal control elements 114 allows for controlling and modifying the critical dimension (CD) spatially for all temperature sensitive processes and therefore increases yield of chips from a wafer. In an exemplary embodiment, manipulation of thermal images can be used to determine thermal output of the electrostatic chuck 112, creation, inversion and verification of a unit response matrix, constrained optimization routines for the inversed problem, and power output for a spatial temperature demand.

Figure 2:
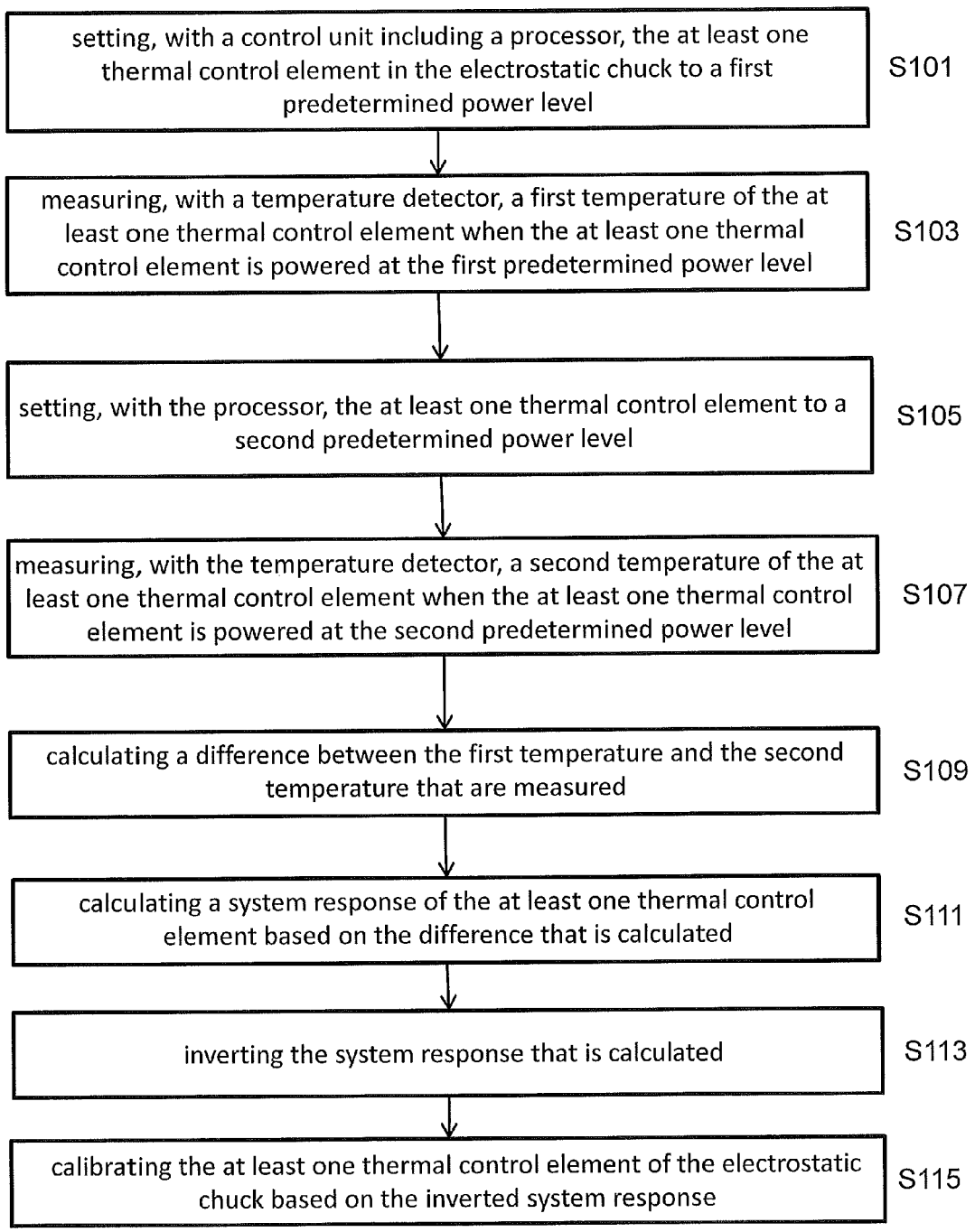
FIG. 2 is a flow chart illustrating an exemplary method of an embodiment.

FIG. 2 shows an exemplary method for calculating power input to at least one thermal control element 114 of an electrostatic chuck 112 having an array of independently controllable heater zones. The method includes a step S101 of setting, with the control unit 116 including the processor 120, the at least one thermal control element 114 in the electrostatic chuck 112 to a first predetermined power level.

Step S103 includes measuring, with the temperature detector 124, a first temperature or spatial temperature response pattern of the at least one thermal control element 114 when the at least one thermal control element 114 is powered at the first predetermined power level. In an exemplary embodiment, the at least one thermal control element 114 is an array of thermal control elements 114. In an exemplary embodiment, each thermal control unit 114 is of similar size to four or less device dies on a wafer.

Step S105 includes setting, with the processor 120, the at least one thermal control element 114 to a second predetermined power level.

Step S107 includes measuring, with the temperature detector 124, a second temperature or spatial temperature response pattern of the at least one thermal control element 114 when the at least one thermal control element 114 is powered at the second predetermined power level. The temperature detector 124 can be, for example an infrared camera, and the first temperature and the second temperature are measured by at least one thermal image taken by the infrared camera.

In an exemplary embodiment, during the setting of the first predetermined power level, all thermal control elements 114 or a group of thermal control elements 114 are set to a same power level, and during the setting of the second predetermined power level, all thermal control elements 114 are not provided with any power. In an exemplary embodiment, the first predetermined power level is a maximum power level for the thermal control elements 114.

Step S109 includes calculating a difference between the first temperature and the second temperature that are measured. Thus, temperature information is gathered from two measurements for each temperature control element 114 and the delta is determined between a temperature control element 114. Instead of measuring a temperature control element 114 at maximum power level, and when it is off, an alternative approach would be to use less than full power for each temperature control element, and/or to power multiple temperature control elements 114 at the same time. Also, in an exemplary embodiment, instead of using one off image per temperature control element 114, one off image in total could be used or one averaged off image, or one average temperature, either determined from an infrared (IR) image, or from a different source, such as but not exclusive to, thermocouple can be used.

Step S111 includes calculating a system response of the at least one thermal control element 114 based on the difference that is calculated. In an exemplary embodiment, the calculated system response is an algorithm to determine a relation between power input and temperature output of the at least one thermal control element 114. In an exemplary embodiment, the calculated system response is a matrix that includes, for example vectors. In an exemplary embodiment, the matrix can be a unit response matrix.

Step S113 includes inverting the system response that is calculated. Step S115 includes calibrating the at least one thermal control element 114 of the electrostatic chuck 112 based on the inverted system response. In an exemplary embodiment, the method can also include validating the calibrating of the at least one thermal control element 114. In an exemplary embodiment, the method of FIG. 2 can be stored on a non-transitory computer readable storage medium.

In an exemplary embodiment, the method can include manipulating the at least one thermal image taken by the infrared camera to perform two-dimensional temperature prediction of the electrostatic chuck 112, and/or the wafer substrate 110. Similarly, the method can include manipulating the at least one thermal image taken by the infrared camera to determine thermal output of the electrostatic chuck 112.

In an exemplary embodiment, to reduce the noise of the IR image difference, multiple images are averaged for each of the measurements. However, the images do not have to be averaged. To reduce the noise further, a binning procedure can be used where, for example, 3×3 pixels are binned into one. At the edge, only pixels inside the electrostatic chuck 112 area are binned. Alternatively, binning can be performed in different pixel sizes (2×2, 4×4, 5×5, . . . , m×n) applying a certain weighting factor ($w_{ij}$) to each pixel of the m×n sub-matrix, or to not bin at all, or to downsample by skipping samples and only save every 2, 3, 4, 5, . . . pixel. However, preferably the spatial resolution is high enough that the binned pixel size is still in the sub-cm range. The dimensions of the matrix can be, for example, a total number of temperature control elements 114 and a number of binned pixels inside the electrostatic chuck 112.

In an exemplary embodiment, to reduce the image to the area of interest, the edge of the electrostatic chuck 112 is detected by taking the difference between the electrostatic chuck 112 with all temperature control elements 114 set to the same finite power level and subtracting an image with no heater powered up. The algorithm, performed by the processor 120 for example, starts close to the (estimated) center of the electrostatic chuck 112 and compares the value of each pixel to its neighboring pixel. The pixel with the highest gradient is assumed to be the edge. This is performed in two directions, and assuming the electrostatic chuck 112 to be a circle, a radius and a centerpoint are determined. An alternative algorithm that can be performed is a binarisation approach with a Hough transform. Alternatively, the detection of the edge can be skipped, and a constant known radius and centerpoint of the electrostatic chuck 112 can be assumed.

In an exemplary embodiment, the delta temperature for each pixel inside the electrostatic chuck 112 is taken and the two-dimensional image is vectorized. This can be either done by rastering the data column by column or row by row. All vectors are put together in a matrix. The matrix has the dimensions of the number of temperature control elements 114 and the number of (binned) pixels inside the electrostatic chuck 112.

In an exemplary embodiment, to verify the unit response matrix (URM), one use case is tested, where each heater (temperature control element) is set to half power and compared to the just calculated $URM_1$:

$$Error = MeasuredImage - 0.5*URM_1$$

$$URM = URM_1 + 2*Error/(\text{Number of Temperature Control Elements})$$

Assuming a small error, this corrects the URM and takes temperature control element 114 interaction into account. Alternatively, this step can be skipped or a different power level can be used. Inverting the URM allows for the construction of a vector matrix system that calculates the power setpoints for a spatial vectorized temperature demand.

$$PowerOutput_1 = URM^{-1} * TDemand$$

Power can be controlled in a digitized manner or in an analog manner. Therefore improving the $PowerOutput_1$ solution from an un-constrained real number domain to a digitally quantized domain with finite range is critical. In an exemplary embodiment, the solution $PowerOutput_1$ can be optimized with two routines. First, a constrained minimum optimization with:

$$\min F(X) \text{ subject to: } A*X<=B, Aeq*X=Beq \text{ (linear constraints)}$$

$$XC(X)<=0, Ceq(X)=0 \text{ (nonlinear constraints)}$$

$$0<=X<=DigitizationNumber \text{ (bounds)}$$

With the DigitizationNumber being the number of digitization steps. Each PowerOutput value is rounded to the next digitized number after this routine and the problem is solved for an integer optimization, where a minimum of the problem:

$$\text{Min}(TDemand - URM * PowerOutput_2)$$

is calculated. The solution $PowerOutput_2$ is used for the temperature control element control. An alternative approach is to only use one or two steps of this three step optimization routine.

In an exemplary embodiment, to validate the calibration, an automated check of a specific temperature demand is implemented. The system calculates (e.g., by the processor device 120) the power output for two defined temperature profiles and measures both temperature profiles. Statistical process control (SPC) limits result in an automated acceptance or not of the calibration.

In an exemplary embodiment, one or both of these checks can be eliminated, or the check can be executed manually instead of automatically.

The inverted matrix, URM$^{-1}$ as described above, allows for full open loop control as an alternative to a closed loop control which would require in situ measurements during process. In an exemplary embodiment, one dimension of the inverted matrix is determined by the number of temperature control elements 114. The other dimension determines the resolution for spatial demand. This can either be the full resolution of the temperature measurement (number of thermocouple, pixels of IR camera, . . . ), a subset of these or with interpolation a number higher than the number of measurement points.

Figure 3:
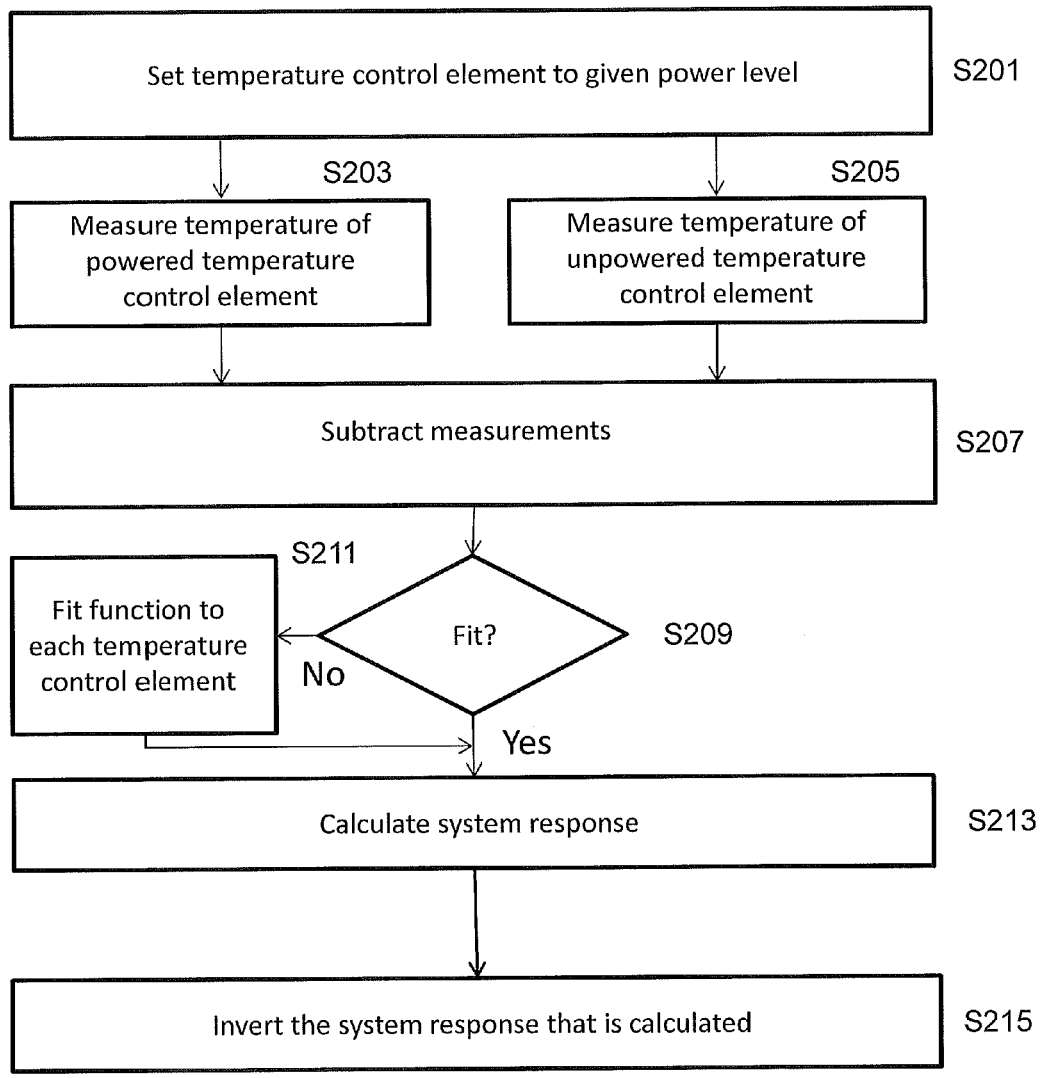
FIG. 3 is a flow chart illustrating an exemplary method of an embodiment.

FIG. 3 shows a flow chart of an exemplary method that is similar to the method of FIG. 2. In step S201, a temperature control element is set to a given power level. In step S203, the temperature of the powered temperature control element is measured. In step S205, the temperature of the temperature control element is measured when it is not powered (i.e., unpowered). In step S207, the measured temperatures are subtracted. In step S209 it is determined whether or not the output of step S207 fits a function. If not, in step S211, a function is fitted to each temperature control element. If the output of step S207 fits the function, the system response is calculated at step S213. In step S215, the system response that is calculated in inverted.

As described above, an exemplary method of this disclosure determines the system response to a specific power input, and by inverting the relation it provides the power demand for a targeted temperature profile without the need of an in situ measurement, and therefore avoiding the associated problems of an in situ measurement such as: calibration of thermal control elements in an electrostatic chuck. The above described methods provide several advantages. For example, not measuring the temperature in situ is cost-effective, since no special diagnostic, analytical tool, and/or user input is needed.

Taking on and off images for each temperature control element 114 eliminates the influence of a shifting baseline. It also overcomes problems with IR camera stabilization and fluctuations in the temperature of adjacent temperature control systems, e.g. coolant fluid. This is important for high accuracy in the determination of the temperature response to a power level.

The problem of noise of an IR image can be addressed in the method by averaging over time and space. This improves the accuracy and precision of the measurement and enables use of off-the-shelf, non-cooled IR cameras instead of costly, high-maintenance and trade restricted cooled cameras.

Each electrostatic chuck 112 can be mounted and dismounted on a calibration stand, and therefore a movable part, such as the IR camera 124, is also movable to provide better access to the electrostatic chuck 112. Using edge detection for each electrostatic chuck 112 ensures image alignment, which improves accuracy and corrects small spatial offsets.

Vectorization of the IR image and the power setpoints allows the problem to be solved in a matrix equation. This allows for inverting the matrix to solve the inverted problem of a temperature demand. Correcting the error between the predicted sum of single heater responses and the measured temperature output of all temperature control elements helps to achieve high accuracy when multiple temperature control elements are used at the same time. This is a very fast, effective way to adjust the unit response matrix to temperature control elements interaction.

Breaking the optimization routine down into three subsections, matrix equation, non-integer optimization with constraints and integer optimization with constraints, gives the highest accuracy for a system of elements with digitized input.

The integrated prediction check includes a prediction and a measurement of the response. Together with a defined SPC limit, it determines if the calibration of an electrostatic chuck was successful during manufacturing and before using the electrostatic chuck in a process.

The electrostatic chuck can be incorporated in a substrate support and/or have various arrangements of heater zones which are heated by the thermal control elements 114. See for example, commonly-assigned U.S. Published Applications 2011/0092072, 2012/0115254, 2013/0068750, 2013/0072035, 2013/0220989, 2013/0270250, all of which are hereby incorporated by reference in their entirety.

While various exemplary embodiments of the disclosed methods have been described above, it should be understood that they have been presented for purposes of example only, not limitations. It is not exhaustive and does not limit the disclosure to the precise form disclosed. Modifications and variations are possible in light of the above teachings or may be acquired from practicing of the disclosure, without departing from the breadth or scope.

What is claimed is:

1. A method for calculating power input to at least one thermal control element of an electrostatic chuck having an array of independently controllable heater zones, the method comprising:

setting, with a control unit including a processor, the at least one thermal control element in the electrostatic chuck to a first predetermined power level;

measuring, with a temperature detector, a first temperature of the at least one thermal control element when the at least one thermal control element is powered at the first predetermined power level;

setting, with the processor, the at least one thermal control element to a second predetermined power level;

measuring, with the temperature detector, a second temperature of the at least one thermal control element when the at least one thermal control element is powered at the second predetermined power level;

calculating a difference between the first temperature and the second temperature that are measured;

calculating a system response of the at least one thermal control element based on the difference that is calculated;

inverting the system response that is calculated; and calibrating the at least one thermal control element of the electrostatic chuck based on the inverted system response.

2. The method of claim 1, wherein the temperature detector is an infrared camera, and the first temperature and the second temperature are measured by at least one thermal image taken by the infrared camera, and the method further comprises:

manipulating the at least one thermal image taken by the infrared camera to perform two-dimensional temperature prediction of the electrostatic chuck or a wafer substrate.

3. The method of claim 1, wherein the calculated system response is an algorithm to determine a relation between power input and temperature output of the at least one thermal control element.

4. The method of claim 1, further comprising:
detecting the edge of the electrostatic chuck by:
- taking a difference between the electrostatic chuck with all temperature control elements set to a same power level and an image with no temperature control elements powered up,
- starting close to an estimated center of the electrostatic chuck and comparing a value of each pixel to its neighboring pixel, and
- determining a pixel with a highest gradient to be the edge.

5. The method of claim 1, further comprising:
detecting the edge of the electrostatic chuck.

6. The method of claim 1, further comprising:
validating the calibrating of the at least one thermal control element.

7. The method of claim 1, wherein during the setting of the first predetermined power level, all thermal control elements of the array are set to a same power level, and during the setting of the second predetermined power level, all thermal control elements of the array are not provided with any power.

8. The method of claim 7, wherein the first predetermined power level is a maximum power level for the thermal control elements.

9. The method of claim 1, wherein the at least one thermal control element is a group of the array or the entire array of thermal control elements.

10. The method of claim 9, wherein the array of thermal control elements includes at least 100 thermal control elements.

11. The method of claim 1, wherein the temperature detector is an infrared camera, and the first temperature and the second temperature are measured by at least one thermal image taken by the infrared camera, and the method further comprises:
manipulating the at least one thermal image taken by the infrared camera to determine thermal output of the electrostatic chuck.

12. The method of claim 11, further comprising:
reducing noise of the thermal image by performing a binning procedure in which n×m pixels are binned into one, where n and m are integers.

13. The method of claim 11, further comprising:
reducing noise of the thermal image by performing a binning procedure in which 2×2 or 3×3 pixels are binned into one.

14. The method of claim 1, wherein the calculated system response is a matrix.

15. The method of claim 2, wherein the matrix includes vectors.

16. The method of claim 2, wherein the matrix is a unit response matrix.

17. The method of claim 2, wherein dimensions of the matrix are total number of temperature control elements and number of binned pixels inside the electrostatic chuck.

18. A method of processing a semiconductor substrate in a plasma processing chamber on which the semiconductor substrate is supported on an electrostatic chuck validated by the method recited in claim 1.

19. A method of processing a semiconductor substrate in a plasma etch chamber on which the semiconductor substrate is supported on an electrostatic chuck validated by the method recited in claim 1.

20. A non-transitory computer readable storage medium, storing instructions, which when executed by a processor, performs a method for calculating power input to at least one thermal control element of an electrostatic chuck having an array of independently controllable heater zones, the method comprising:
- setting the at least one thermal control element in the electrostatic chuck to a first predetermined power level;
- measuring, with a temperature detector, a first temperature of the at least one thermal control element when the at least one thermal control element is powered at the first predetermined power level;
- setting the at least one thermal control element to a second predetermined power level;
- measuring, with the temperature detector, a second temperature of the at least one thermal control element when the at least one thermal control element is powered at the second predetermined power level;
- calculating a difference between the first temperature and the second temperature that are measured;
- calculating a system response of the at least one thermal control element based on the difference that is calculated;
- inverting the system response that is calculated; and
- calibrating the at least one thermal control element of the electrostatic chuck based on the inverted system response.

* * * * *